United States Patent
Scott et al.

(10) Patent No.: US 6,525,348 B1
(45) Date of Patent: Feb. 25, 2003

(54) TWO TERMINAL EDGE ILLUMINATED EPILAYER WAVEGUIDE PHOTOTRANSISTOR

(76) Inventors: David C. Scott, 11332 E. 214th St., Lakewood, CA (US) 90715; Timothy A. Vang, 1004 Calle Carrillo, San Dimas, CA (US) 91773; Srinath Kalluri, 22681 Oak Grove Ave., #325, Aliso Viejo, CA (US) 92656

( * ) Notice: Subject to any disclaimer, the term of this patent is extended or adjusted under 35 U.S.C. 154(b) by 0 days.

(21) Appl. No.: 09/907,318

(22) Filed: Jul. 17, 2001

(51) Int. Cl.[7] .......................................... H01L 31/0328
(52) U.S. Cl. ................. 257/187; 257/188; 257/192; 257/198; 257/200
(58) Field of Search ................................ 257/184, 187, 257/462, 458, 192, 195, 197, 198

(56) References Cited

U.S. PATENT DOCUMENTS 5,689,122 A * 11/1997 Chandrasekhar ............ 257/184
5,729,033 A *  3/1998 Hafizi ........................ 257/197
5,889,296 A *  3/1999 Imamura et al. ............ 257/184
6,137,123 A * 10/2000 Yang et al. .................. 257/184
6,177,710 B1 *  1/2001 Nishikata et al. ........... 257/429

* cited by examiner

*Primary Examiner*—Chandra Chaudhari
*Assistant Examiner*—David L. Hogans
(74) *Attorney, Agent, or Firm*—Parsons & Goltry; Robert A. Parsons; Michael W. Goltry

(57) ABSTRACT

An edge illuminated epilayer waveguide phototransistor including a subcollector layer formed from an epitaxially grown quaternary semiconductor material, such as heavily doped InGaAsP. A collector region of undoped InGaAs is epitaxially grown on the subcollector layer. A base region of moderately doped InGaAs is epitaxially grown on the collector layer. An emitter region, including a doped InGaAsP layer, a doped InP layer, and a heavily doped InGaAs emitter contact layer, is epitaxially grown on the base layer. The various layers and regions are formed so as to define an edge-illuminated facet for receiving incident light. Also, the base does not have an ohmic contact so that the base thickness can be minimized. Finally, the base doping concentration is minimized so that the gain-bandwidth product can be maximized.

22 Claims, 1 Drawing Sheet

TWO TERMINAL EDGE ILLUMINATED EPILAYER WAVEGUIDE PHOTOTRANSISTOR

FIELD OF THE INVENTION

This invention relates to phototransistors.

More particularly, the present invention relates to two terminal edge illuminated heterojunction bipolar phototransistors (HBPTs).

BACKGROUND OF THE INVENTION

As the bit rates of telecommunication and data communication systems increase, the demands on the performance requirements of photoreceivers increase. Photoreceivers are used to convert incident light pulses into electrical current. As bit rates extend beyond 40 Gbit/s, the sensitivity of optical receivers tends to decrease, causing degradation in the overall performance of the optical communications link. Receiver sensitivity has been improved in the prior art by implementing either avalanche photodetectors (hereinafter referred to as "APDs") or heterojunction bipolar phototransistors (hereinafter referred to as "HBPTs") as the optical detection element.

APDs improve the receiver sensitivity by providing internal optical to electrical gain through the avalanche multiplication process. Some of the problems associated with implementing APDs in the receiver circuits are that the avalanche multiplication process is an inherently noisy process and requires excessively high bias voltages on the order of 40 volts to achieve the desired gain. The high electric fields that result from these excessively high bias voltages lead to reliability problems that cause premature failure. Many engineering solutions need to be implemented to circumvent these issues. As such, the fabrication and device layer profile are highly specialized for the APD, which prevents the monolithic integration of the APD with the transimpedance amplifier (TIA) circuit. The resulting consequence of this specialization is that it is unlikely that front-end optical receivers that are based on APDs will be able to operate at 40 Gbps bit rates or beyond due to the excessive parasitic losses that come from the hybrid integration of the APD with the rest of the circuit.

An improvement over the APD is the HBPT. Typically, the HBPT is designed in a manner similar to heterojunction bipolar transistors (HBTs) that are optimized for electrical circuit performance where the doping and the thickness of the base layer are chosen to minimize the lateral base resistance. In typical HBT devices, the base is doped around $1 \times 10^{20}$ cm$^{-3}$ and the base thickness is around 500 Å. The lateral base resistance is an important parameter in the design of HBT circuits as it adversely affects the $f_{max}$, which is a FIGURE of merit that is known to those familiar with the art. Unfortunately, the high doping levels in the base and the thickness of the base reduce the current gain and bandwidth of the HBT because of excess recombination rates due to Auger recombination and the increased base transit times. In the prior art, a high base doping and large base layer thickness are deemed necessary to reduce the lateral base resistance to optimize the overall performance of HBTS. What is desired at high bit rates is a device structure that can improve the gain-bandwidth product of the HBPT. The gain-bandwidth product can be significantly improved by making a modification to the standard HBT epilayer profile.

When the HBT is used as an optical detector (HBPT), the base resistance is less important since the HBT is controlled by an optical signal rather than an electrical signal applied to its base terminal. Hence, minimizing the lateral base resistance in the HBPT has less benefits and the gain-bandwidth product of the HBPT is unnecessarily sacrificed. As such, the base doping and base layer thickness can be significantly reduced in order to increase the gain-bandwidth product of the HBPT device.

It would be highly advantageous, therefore, to remedy the foregoing and other deficiencies inherent in the prior art.

Accordingly, it is an object of the present invention to provide a new and improved two terminal edge illuminated heterojunction bipolar phototransistor.

It is an object of the present invention to provide a new and improved two terminal edge illuminated heterojunction bipolar phototransistor which has a superior gain-bandwidth product compared to current phototransistor devices.

It is another object of the present invention to provide a new and improved two terminal edge illuminated heterojunction bipolar phototransistor which has a short carrier transit-time.

And another object of the invention is to provide a new and improved two terminal edge illuminated heterojunction bipolar phototransistor which has a high internal quantum efficiency.

Still another object of the present invention is to provide a new and improved two terminal edge illuminated heterojunction bipolar phototransistor which has a high external coupling efficiency.

A further object of the invention is to provide a new and improved two terminal edge illuminated heterojunction bipolar phototransistor which has the ability to perform at bit rates greater than 40 Gbits/second.

SUMMARY OF THE INVENTION

To achieve the objects and advantages specified above and others, a two terminal edge illuminated epilayer waveguide phototransistor (hereinafter referred to as "WPT") is disclosed which includes a subcollector layer formed from an epitaxially grown quaternary semiconductor material that is grown on a semiconductor substrate. The epitaxially grown quaternary semiconductor material improves the optical waveguide mode properties. A collector region is epitaxially grown on the subcollector layer. A base region is epitaxially grown on the collector layer. An emitter region is then epitaxially grown on the base region. The various layers and regions are formed so as to define an edge-illuminated facet for receiving incident light. Further, ohmic contacts are formed to the subcollector and emitter regions to allow electrical signals to be extracted from the phototransistor. Finally, the base does not have an ohmic contact so that the base thickness can be minimized.

In a preferred embodiment, the subcollector region consists of an InGaAsP quaternary semiconductor with a composition that corresponds to a bandgap wavelength of 1.15 μm. The InGaAsP subcollector is a unique advantage that allows the optimization of the input optical coupling efficiency without sacrificing the phototransistor's electrical performance. The InGaAsP subcollector expands the optical mode in the vertical direction, which increases the input mode coupling efficiency to commercially available lensed optical fibers without degrading the electrical properties of the device. The heavily doped InGaAsP subcollector also maintains the necessary electrical characteristics needed for high performance device operation. In addition, the base region does not contain an ohmic base contact layer so that the base region thickness can be minimized and, consequently, the current gain is increased. The base region is also moderately doped. By removing the ohmic base contact layer and minimizing the base doping, the optical to electrical conversion gain is increased and the base transit time is reduced. This improvement in performance will allow the WPT discussed here to perform at higher bit rates.

The waveguide phototransistor discussed here will eliminate all of the previously mentioned issues associated with the APD and improve the performance of phototransistors typically used as photoreceivers. The waveguide phototransistor uses a subcollector region that expands the optical mode size vertically without degrading the electrical properties of the device. Expanding the optical mode size in this manner increases the input optical coupling efficiency. Also, the WPT has improved performance because the doping and the thickness of the base layer are chosen to maximize the gain-bandwidth product ($f_T$).

The waveguide phototransistor geometry has inherent advantages over top-illuminated phototransistors that have been demonstrated in the prior art. Some problems associated with the top-illuminated approach include the fact that the thickness of the absorbing layers must be increased to above 1 $\mu$m in order to absorb greater than 90% of the incident light. This leads to poor frequency response of the top-illuminated phototransistor due to the excessive base and collector carrier transit-times. The waveguide phototransistor geometry solves this problem because the light propagates and gets absorbed down the length of the device in a direction that is orthogonal to the flow of electrical carriers. As such, the thickness of the absorbing layers can be kept small such that the base and collector transit-times are short which allows for high-speed operation.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which the single FIGURE is an isometric view of a two terminal edge illuminated epilayer waveguide phototransistor in accordance with the present invention.

DETAILED DESCRIPTION OF THE PREFERRED EMBODIMENT

Figure 1:
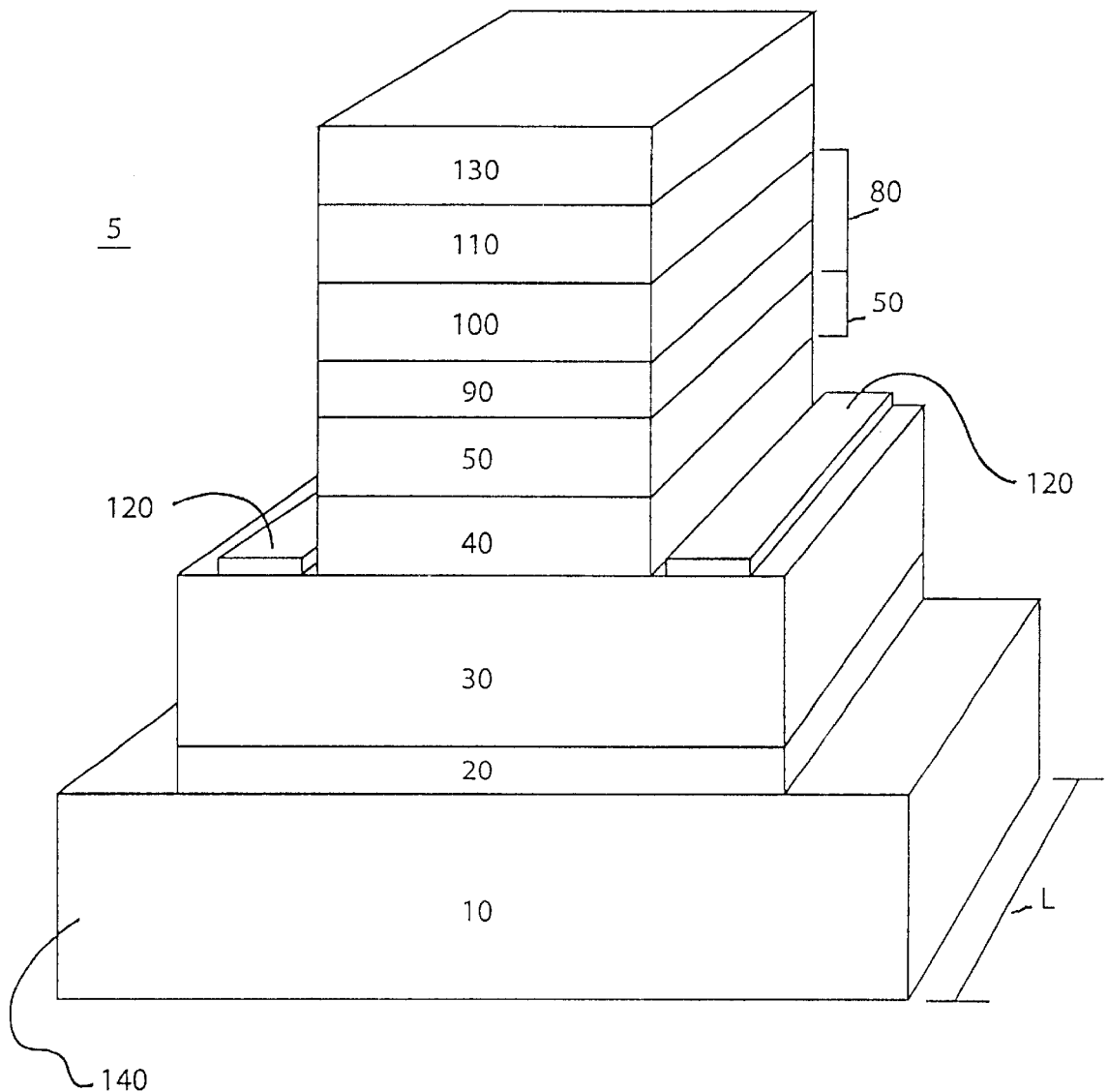

Turn now to the drawing which illustrates an isometric cross sectional view of a two terminal edge illuminated epilayer waveguide phototransistor 5 in accordance with the present invention. Edge illuminated epilayer waveguide phototransistor 5 includes a substrate 10 which in this embodiment is formed of semi-insulating InP. It will be understood that substrate 10 can be any convenient material that is compatible with layers subsequently grown thereon. A buffer layer 20 can be included to provide a pristine surface onto which the device structure can be grown with minimal defects. In this preferred embodiment the buffer layer 20 is composed of InP and is approximately 0.1 $\mu$m thick. It will be understood that buffer layer 20 can be the same material as substrate 10 or can be composed of an alloy to allow lattice matching to subsequent layers grown thereon. A subcollector layer 30 is then epitaxially grown on area 20. In this preferred embodiment, subcollector layer 30 consists of a heavily n-type doped InGaAsP quaternary alloy with a composition that corresponds to a bandgap wavelength of 1.15 $\mu$m. The alloy composition of the InGaAsP quaternary is chosen so that it is transparent to the optical wavelengths of interest. It will be understood that subcollector layer 30 can be composed of any quaternary material that allows the desired device performance. Also, in this preferred embodiment, the subcollector layer 30 is approximately 0.85 $\mu$m thick, which allows low sheet resistance values (about 20 $\Omega$/square).

The combination of using heavily doped InGaAsP of this composition and a thick subcollector layer 30 allows the achievement of low sheet and contact resistances needed for high-speed device operation. The key reason for using a transparent InGaAsP quaternary for the subcollector is that it expands the optical mode in the vertical direction and thereby increases the input mode coupling from commercially available lensed optical fibers.

A collector layer 40 is epitaxially grown on subcollector layer 30. In this preferred embodiment the collector layer 40 is composed of undoped InGaAs and is approximately 0.4 $\mu$m thick. The material of the collector layer is chosen such that it absorbs the optical wavelengths of interest. It will be understood that collector layer 40 can be composed of any material that allows the desired device performance. The thickness of the collector layer 40 is chosen to obtain the desired transit frequency, breakdown voltage, base-collector capacitance, and rate of optical absorption. The collector layer 40 thickness of 0.4 $\mu$m allows transit frequencies of approximately 130 GHz, which is needed for 40 Gbps data transmission rates.

A p-type doped InGaAs base region 50 is then epitaxially grown on collector layer 40. In this preferred embodiment, the p-type doped InGaAs base region 50 is approximately 100 Å thick and has a doping concentration of around $1\times10^{17}$ cm$^{-3}$. Those familiar with the art will recognize that typically the base has a thickness of around 500 Å and a doping concentration around $1\times10^{20}$ cm$^{-3}$. A high base doping increases the recombination rate in the base because of Auger recombination. In addition, extremely high base doping complicates the device growth because of the possibility of the base dopants diffusing into the emitter. Also, in the prior art, the thickness of the base is chosen as a tradeoff between obtaining the desired base sheet resistance and base transit time. However, in the two terminal edge illuminated epilayer waveguide phototransistor 5, the thickness is around a factor of five smaller and the base doping concentration is around three orders of magnitude less than typical phototransistor devices. Those familiar in the art of device physics of heterojunction bipolar transistors will recognize that these changes in the base layer translate into large increases in the gain-bandwidth product, which is the important FIGURE of merit to optimize in phototransistor devices.

An emitter region 80 is epitaxially grown on the p-type doped InGaAs base region 50. Emitter region 80 consists of an n-type doped InGaAsP emitter layer 90 which is approximately 0.1 $\mu$m thick onto which an n-type doped InP emitter layer 100 is epitaxially grown. The n-type doped InP emitter layer 100 is approximately 0.5 $\mu$m thick. The composition of the n-type doped InGaAsP emitter layer 90 is chosen so that the bandgap wavelength is approximately 1.15 $\mu$m, which is required to center the optical mode with collector layer 40 and base region 50. Centering the optical mode increases the rate of optical absorption. An ohmic emitter contact layer 110 is then deposited onto the n-type doped InP emitter layer 100. In this preferred embodiment, the ohmic emitter contact layer 110 is composed of heavily n-type doped InGaAs and is approximately 0.05 $\mu$m thick. The thickness of the n-type doped InP emitter layer 100 is chosen to prevent the optical mode from overlapping the ohmic emitter contact layer 110 and causing unwanted optical loss and reducing the optical to electrical conversion efficiency of the device.

It will be understood that many different configurations can be used to produce the base and emitter regions, including using multiple layers of various semiconductor alloys or by using different doping configurations.

Finally, ohmic contacts need to be provided to emitter contact layer 110 and subcollector layer 30. Ohmic contacts are made by wet-etching the device down through layers 130, 110, 100, 90, 50, and 40. The profile of the etch is vertical and stops at the top of subcollector layer 30. In the preferred embodiment, the wet-etching process is such that layers 130, 110, 100, 90, 50, and 40 define a mesa having a width of 2 $\mu$m and a length of 7 $\mu$m. The width could be made smaller to improve the speed of the device, but this would reduce the input optical coupling efficiency. An ohmic Ti/Pt/Au metallization is then deposited on the subcollector layer 30 and the emitter contact layer 110. This forms the emitter metallization 130 and subcollector metallization 120 via a standard self-aligned metallization process. The elimination of the ohmic base contact metal allows the ohmic subcollector contact layer to be self-aligned to the emitter, thereby significantly reducing the parasitic collector series resistance over conventional HBT or phototransistor structures. Also, the elimination of the base contact layer reduces the area of the base-collector depletion region, which reduces the base-collector depletion capacitance and increases the speed of the device.

In addition to considering the electrical properties of the edge illuminated epilayer waveguide phototransistor 5, it is necessary to consider the optical properties as well. The subcollector layer, collector layer, base region, and emitter region are formed so as to define an edge-illuminated facet 140 for receiving incident light. The undoped InGaAs collector region 40 and base region 50 both serve as the region of optical absorption. Hence, the thickness of the InGaAs collector region 40 and base region 50 need to be such that all of the light is absorbed after it impinges through edge-illuminated facet 140 and travels down the length of collector layer 40 and base region 50. A collector layer 40 thickness of 0.4 $\mu$m gives an internal quantum efficiency of greater than 90% for device lengths approximately 7 $\mu$m. An internal quantum efficiency of greater than 90% is sufficient for device operation.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. Edge illuminated epilayer waveguide phototransistor comprising:
   a subcollector layer formed of an epitaxially grown quaternary semiconductor;
   a collector region epitaxially grown on the subcollector layer;
   a base region epitaxially grown on the collector region having a thickness in a range of approximately 50 Å to 150 Å and a doping concentration in the range of approximately $1 \times 10^{16}$ cm$^{-3}$ to $1 \times 10^{18}$ cm$^{-3}$;
   an emitter region epitaxially grown on the base region; and
   the subcollector layer, the collector region, the base region, and the emitter region being formed so as to define an edge illuminated facet for receiving incident light.

2. Edge illuminated epilayer waveguide phototransistor as claimed in claim 1 wherein the subcollector layer is epitaxially grown on an InP substrate.

3. Edge illuminated epilayer waveguide phototransistor as claimed in claim 2 wherein the subcollector layer is composed of InGaAsP.

4. Edge illuminated epilayer waveguide phototransistor as claimed in claim 3 wherein the InGaAsP subcollector layer includes a composition that is transparent at the optical wavelengths of interest.

5. Edge illuminated epilayer waveguide phototransistor as claimed in claim 4 wherein the InGaAsP subcollector layer includes an InGaAsP composition that corresponds to a band gap wavelength of 1.15 $\mu$m.

6. Edge illuminated epilayer waveguide phototransistor as claimed in claim 1 wherein the subcollector layer has a thickness in a range of approximately 0.80 $\mu$m to 0.90 $\mu$m.

7. Edge illuminated epilayer waveguide phototransistor as claimed in claim 6 wherein the subcollector layer is doped to provide a sheet resistance value in a range of 20 $\Omega$/square to 30 $\Omega$/square.

8. Edge illuminated epilayer waveguide phototransistor as claimed in claim 1 wherein the collector region includes an undoped InGaAs layer with a thickness chosen to optimize the transit frequency, breakdown voltage, base-collector capacitance, and rate of optical absorption.

9. Edge illuminated epilayer waveguide phototransistor as claimed in claim 8 wherein the collector region thickness is in a range of 0.3 $\mu$m to 0.5 $\mu$m.

10. Edge illuminated epilayer waveguide phototransistor as claimed in claim 8 wherein the collector region thickness is approximately 0.4 $\mu$m.

11. Edge illuminated epilayer waveguide phototransistor as claimed in claim 8 wherein the collector region thickness is chosen to provide a transit frequency of approximately 130 GHz.

12. Edge illuminated epilayer waveguide phototransistor as claimed in claim 8 wherein the collector region has a length and thickness selected to provide an internal quantum efficiency greater than approximately 90%.

13. Edge illuminated epilayer waveguide phototransistor as claimed in claim 1 wherein the base region includes a moderately doped base layer.

14. Edge illuminated epilayer waveguide phototransistor as claimed in claim 1 wherein the emitter region includes a layer of InGaAsP, a layer of InP, and an emitter contact layer.

15. Edge illuminated epilayer waveguide phototransistor as claimed in claim 14 wherein the layer of InGaAsP has a thickness large enough to prevent optical absorption loss in the emitter contact layer.

16. Edge illuminated epilayer waveguide phototransistor as claimed in claim 15 wherein the InP emitter layer has a thickness in a range of 0.3 $\mu$m to 0.7 $\mu$m.

17. Edge illuminated epilayer waveguide phototransistor as claimed in claim 16 wherein the InP emitter layer has a thickness of approximately 0.5 $\mu$m.

18. Edge illuminated epilayer waveguide phototransistor as claimed in claim 14 wherein the emitter contact layer is formed of InGaAs.

19. Edge illuminated epilayer waveguide phototransistor as claimed in claim 1 wherein the base region has a thickness of approximately 100 Å.

20. Edge illuminated epilayer waveguide phototransistor as claimed in claim 1 wherein the base region has a doping concentration of approximately $1 \times 10^{17}$ cm$^{-3}$.

21. Edge illuminated epilayer waveguide phototransistor comprising:

- a subcollector layer formed of doped InGaAsP with a thickness in a range of 0.80 $\mu$m to 0.90 $\mu$m;
- a collector layer of undoped InGaAs with a thickness in a range of 0.3 $\mu$m to 0.5 $\mu$m epitaxially grown on the subcollector layer;
- a base region including a doped InGaAs layer epitaxially grown on the collector layer having a thickness in a range of approximately 50 Å to 150 Å and a doping concentration in the range of approximately $1 \times 10^{16}$ cm$^{-3}$ to $1 \times 10^{18}$ cm$^{-3}$;
- an emitter region including a doped InGaAsP layer having a thickness in a range of 0.05 $\mu$m to 0.15 $\mu$m and epitaxially grown on the doped InGaAs layer of the base region, a doped InP layer having a thickness in a range of 0.3 $\mu$m to 0.7 $\mu$m epitaxially grown on the doped InGaAsP layer and a doped InGaAs emitter contact layer epitaxially grown on the doped InP layer; and
- the subcollector layer, the collector layer, the base region, and the emitter region being formed so as to define an edge illuminated facet with an optical mode for receiving incident light.

22. Edge illuminated epilayer waveguide phototransistor as claimed in claim 21 wherein the subcollector layer, the collector layer, the base region, and the emitter region define a mesa having a width in a range of 1.0 $\mu$m to 5.0 $\mu$m and a length long enough to achieve a greater than 90% internal optical absorption efficiency.

* * * * *